(12) United States Patent
Hood et al.

(10) Patent No.: US 9,973,329 B2
(45) Date of Patent: *May 15, 2018

(54) CIRCUIT AND METHOD FOR CREATING ADDITIONAL DATA TRANSITIONS

(71) Applicant: INPHI CORPORATION, Santa Clara, CA (US)

(72) Inventors: Sheldon James Hood, Richmond (CA); Paul Thomas Banens, Kanata (CA)

(73) Assignee: INPHI CORPORATION, Santa Clara, CA (US)

(*) Notice: Subject to any disclaimer, the term of this patent is extended or adjusted under 35 U.S.C. 154(b) by 0 days. days.

This patent is subject to a terminal disclaimer.

(21) Appl. No.: 15/474,593

(22) Filed: Mar. 30, 2017

(65) Prior Publication Data

US 2017/0207904 A1 Jul. 20, 2017

Related U.S. Application Data

(63) Continuation of application No. 14/858,347, filed on Sep. 18, 2015, now Pat. No. 9,647,825.

(51) Int. Cl.
*H04L 7/00* (2006.01)
*H04B 1/04* (2006.01)
*H03K 19/21* (2006.01)
*H03L 7/08* (2006.01)

(52) U.S. Cl.
CPC .............. *H04L 7/0016* (2013.01); *H04B 1/04* (2013.01); *H03K 19/21* (2013.01); *H03L 7/0807* (2013.01)

(58) Field of Classification Search
CPC ........ H04L 7/0016; H04B 1/04; H03K 19/21; H03L 7/0807
See application file for complete search history.

(56) References Cited

U.S. PATENT DOCUMENTS

| 9,647,825 B2 * | 5/2017 | Hood | H03K 5/135 |
| 2004/0147277 A1 * | 7/2004 | Kaewell | H04B 1/036 455/522 |
| 2015/0043628 A1 * | 2/2015 | Rane | H04L 25/03019 375/232 |

* cited by examiner

*Primary Examiner* — Jianye Wu
(74) *Attorney, Agent, or Firm* — Richard T. Ogawa; Ogawa P.C.

(57) ABSTRACT

When a data path includes CMOS circuitry, such circuitry may introduce jitter into the data signal. Embodiments are described in which additional data transitions are made to occur, and these additional data transitions may change the characteristics of the data frequency content transferred to the power supply so that such noise may be better filtered. This may have an effect of reducing jitter in the data signal. In one embodiment, a second data signal is generated to be a version of a first data signal with every second bit inverted. Second CMOS circuitry receives the second data signal in parallel to first CMOS circuitry receiving the first data signal. The first CMOS circuitry and the second CMOS circuitry are connected to a same power supply.

20 Claims, 11 Drawing Sheets

CIRCUIT AND METHOD FOR CREATING ADDITIONAL DATA TRANSITIONS

CROSS-REFERENCE TO RELATED APPLICATION

The present application is a continuation of U.S. patent application Ser. No. 14/858,347 filed Sep. 18, 2015, the entire contents of which is incorporated herein by reference.

FIELD

The following relates to jitter reduction in a circuit.

BACKGROUND

Integrated circuits that are constructed using complementary metal-oxide-semiconductor (CMOS) technology may offer advantages over previous circuit technology, such as lower cost and higher speed. For this reason, CMOS is a technology of choice for constructing integrated circuits in many applications.

In a communication system a transmitter may be constructed using CMOS circuitry. Such circuitry may be used in the data path of the transmitter to prepare a data signal to be transmitted through a channel.

However, when the data path includes CMOS circuitry, such circuitry may introduce jitter into the data signal.

For a signal of a given baud rate jitter may be considered a measure of the deviations of the signal edges, at a defined threshold, with respect to an ideal (perfect) signal the same baud rate. It may be measured as a peak-to-peak value or a root mean square (rms) value. Jitter is often broken down into narrower definitions, which may include random jitter, sinusoidal jitter, data dependent jitter and more.

SUMMARY

In some parts of the data path, the presence of jitter may not be too much of a concern, as long as the jitter is not too drastic, as the data may be re-timed. However, in other parts of the data path the jitter spec may be an important parameter, with it being desirable or necessary that the jitter be reduced or kept to a minimum.

Embodiments are described in which additional data transitions are made to occur, and these additional data transitions may change the characteristics of the data frequency content transferred to the power supply so that such noise may be better filtered. This may have an effect of reducing jitter in the data signal.

In one embodiment, there is provided a circuit having first CMOS circuitry to receive a first data signal representing a plurality of bits. The circuit further has a signal generating circuit to generate a second data signal so that the second data signal is a version of the first data signal with every second bit of the plurality of bits inverted. The circuit further has second CMOS circuitry to receive the second data signal in parallel to the first CMOS circuitry receiving the first data signal to result in a data transition in either the first CMOS circuitry or the second CMOS circuitry every bit period for the plurality of bits. The first CMOS circuitry and the second CMOS circuitry are connected to a same power supply.

In some embodiments, the second CMOS circuitry may be substantially the same as the first CMOS circuitry.

In some embodiments, the circuit further includes a first multiplexer to multiplex a pair of half-rate data signals to produce the first data signal, and the signal generating circuit includes: an inverter to invert one of the pair of half-rate data signals to produce an inverted half-rate data signal, and a second multiplexer to multiplex the inverted half-rate data signal with the other one of the pair of half-rate data signals to produce the second data signal.

In some embodiments, the same power supply is a first power supply, and the circuit further includes third CMOS circuitry to output the pair of half-rate data signals, the third CMOS circuitry connected to a second power supply and not connected to the first power supply.

In some embodiments, the circuit includes fourth CMOS circuitry to output a clock used to select an input line of at least the first multiplexer. The fourth CMOS circuitry is connected to a third power supply and is not connected to the first power supply or the second power supply.

In some embodiments, the circuit includes a capacitor that creates a filter to filter data frequency content. The data frequency content is made more narrowband by having the data transition in either the first CMOS circuitry or the second CMOS circuitry every bit period for the plurality of bits.

In some embodiments, the first CMOS circuitry specifically comprises a plurality of CMOS gates connected in series to perform drive amplification of the first data signal, and the second CMOS circuitry comprises a copy of the plurality of CMOS gates connected in series to perform drive amplification of the second data signal.

In some embodiments, the signal generating circuit comprises either: (1) an exclusive-or (XOR) logic gate to receive as an input the first data signal and a clock, and to produce as an output the second data signal equal to an XOR of the first data signal and the clock; or (2) a multiplexer to receive as an input the first data signal in differential form $D_{in}$ and $\overline{D_{in}}$, and to output the second data signal by alternately selecting between $D_{in}$ and $\overline{D_{in}}$.

In some embodiments, the circuit includes a first multiplexer to multiplex four quarter-rate data signals to produce the first data signal, and the signal generating circuit comprises: an inverter to invert one of the quarter-rate data signals to produce a first inverted quarter-rate data signal; another inverter to invert another one of the quarter-rate data signals to produce a second inverted quarter-rate data signal; and a second multiplexer to produce the second data signal by multiplexing the first inverted quarter-rate data signal, the second inverted quarter-rate data signal, and the remaining other two quarter-rate data signals that were not inverted.

In another embodiment, there is provided a transmitter having a first multiplexer to multiplex a pair of half-rate data signals to produce a first full-rate data signal. The transmitter further includes first CMOS circuitry to receive the first full-rate data signal. The transmitter further includes an inverter to invert one of the pair of half-rate data signals to produce an inverted half-rate data signal, and a second multiplexer to multiplex the inverted half-rate data signal with the other one of the pair of half-rate data signals to produce a second full-rate data signal. The transmitter further includes second CMOS circuitry to receive the second full-rate data signal in parallel to the first CMOS circuitry receiving the first full-rate data signal to result in a data transition in either the first CMOS circuitry or the second. CMOS circuitry every hit period. The first CMOS circuitry and the second CMOS circuitry are connected to a same power supply, and the second CMOS circuitry is substantially the same as the first CMOS circuitry. In some such embodiments, the first CMOS circuitry comprises a plurality of CMOS gates connected in series to perform drive amplification of the first full-rate data signal, and the second CMOS circuitry comprises a copy of the first CMOS circuitry to perform drive amplification of the second full-rate data signal.

In another embodiment, there is provided a method including: receiving a first data signal representing a plurality of bits at first CMOS circuitry; generating a second data signal so that the second data signal is a version of the first data signal with every second bit of the plurality of bits inverted; and receiving the second data signal at second CMOS circuitry in parallel to receiving the first data signal at the first CMOS circuitry to result in a data transition in either the first CMOS circuitry or the second CMOS circuitry every bit period for the plurality of bits. The first CMOS circuitry and the second CMOS circuitry are connected to a same power supply.

In some embodiments of the method, the second CMOS circuitry is substantially the same as the first CMOS circuitry.

In some embodiments, the method includes multiplexing a pair of half-rate data signals to produce the first data signal, and the step of generating the second data signal comprises: inverting one of the pair of half-rate data signals to produce an inverted half-rate data signal; and multiplexing the inverted half-rate data signal with the other one of the pair of half-rate data signals to produce the second data signal.

In some embodiments the same power supply is a first power supply, and the method further comprises outputting the pair of half-rate data signals from third CMOS circuitry. The third CMOS circuitry is connected to a second power supply and is not connected to the first power supply.

In some embodiments, the method further includes outputting a clock from fourth CMOS circuitry, the clock used as a selector in multiplexing the pair of half-rate data signals to produce the first data signal. The fourth CMOS circuitry is connected to a third power supply and is not connected to the first power supply or the second power supply.

In some embodiments, the method further includes filtering data frequency content that is made more narrowband by having the data transition in either the first CMOS circuitry or the second CMOS circuitry every bit period for the plurality of bits.

In some embodiments, the first CMOS circuitry and the second CMOS circuitry each comprise a plurality of CMOS gates connected in series, and the method further comprises: performing drive amplification of the first data signal in the first CMOS circuitry; and performing drive amplification of the second data signal in the second CMOS circuitry.

In some embodiments, generating the second data signal comprises either: (1) performing an exclusive-or (XOR) of the first data signal and a clock to produce the second data signal; or (2) receiving the first data signal at a multiplexer in differential form $D_{in}$ and $\overline{D_{in}}$, and alternately selecting between $D_{in}$ and $\overline{D_{in}}$ to output the second data signal.

In some embodiments, the method further includes multiplexing four quarter-rate data signals to produce the first data signal, and generating the second data signal comprises: inverting one of the quarter-rate data signals to produce a first inverted quarter-rate data signal; inverting another one of the quarter-rate data signals to produce a second inverted quarter-rate data signal; and producing the second data signal by multiplexing the first inverted quarter-rate data signal, the second inverted quarter-rate data signal, and the remaining other two quarter-rate data signals that were not inverted.

Other aspects and features will become apparent to those of ordinary skill in the art upon review of the following description.

BRIEF DESCRIPTION OF THE DRAWINGS

Embodiments will be described, by way of example only, with reference to the accompanying figures wherein.

DETAILED DESCRIPTION

For illustrative purposes, specific example embodiments will now be explained in greater detail below in conjunction with the figures.

The embodiments set forth herein represent information sufficient to practice the claimed subject matter. Upon reading the following description in light of the accompanying figures, those of sufficient skill will understand the concepts of the claimed subject matter and will recognize applications of these concepts not particularly addressed herein. It should be understood that these concepts and applications fall within the scope of the disclosure and the accompanying claims.

Moreover, it will be appreciated that any module, component, or device exemplified herein that executes instructions may include or otherwise have access to a non-transitory computer/processor readable storage medium or media for storage of information, such as computer processor readable instructions, data structures, program modules, and/or other data. A non-exhaustive list of examples of non-transitory computer/processor readable storage media includes magnetic cassettes, magnetic tape, magnetic disk storage or other magnetic storage devices, optical disks such as compact disc read-only memory (CD-ROM), digital video discs or digital versatile disc (i.e. DVDs), Blu-ray Disc™, or other optical storage, volatile and non-volatile, removable and non-removable media implemented in any method or technology, random-access memory (RAM), read-only memory (ROM), electrically erasable programmable read-only memory (EEPROM), flash memory or other memory technology. Any such non-transitory computer/processor storage media may be part of a device or accessible or connectable thereto. Any application or module herein described may be implemented using computer/processor readable/executable instructions that may be stored or otherwise held by such non-transitory computer/processor readable storage media.

Turning now to the figures, some specific example embodiments will be described.

CMOS circuitry may introduce jitter into a data signal. As explained below, at least some of such jitter may originate from a propagation delay in the CMOS circuitry that varies due to the data transitions.

Figure 1:
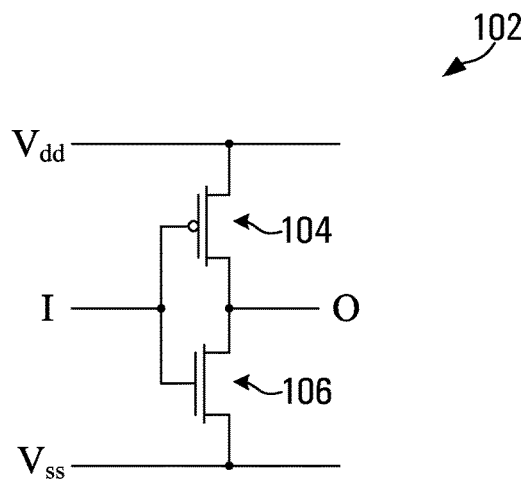
FIG. 1 is a diagram of an example CMOS inverter.

FIG. 1 is a diagram of an example CMOS gate implementing an inverter 102. The CMOS inverter 102 contains a PMOS transistor 104 and an NMOS transistor 106 connected at drain and gate terminals. The CMOS inverter 102 is connected to voltages $V_{dd}$ and $V_{ss}$. In this example, the voltage $V_{dd}$ is a power supply voltage that is ultimately derived from a chip power supply input, and the voltage $V_{ss}$ is "ground" (GND) or 0 volts. The CMOS inverter 102 also has an input I and a corresponding output O. When a voltage applied to the input I is "high" (e.g. the input voltage at I is equal to $V_{dd}$), then the voltage at the output O will be "low" (e.g. the output voltage at O is equal to $V_{ss}$). The converse is also true. That is, when a voltage applied to the input I is "low" (e.g. the input voltage at I is equal to $V_{ss}$), then the voltage at the output O will be "high" (e.g. the output voltage at O is equal to $V_{dd}$).

In operation, a binary or non-return-to-zero (NRZ) data signal representing a plurality of bits is applied to the input I of the inverter 102. The bits represented by the data signal are in a random or pseudo-random pattern. During each bit period the data signal either has a "high" voltage or a "low" voltage depending upon whether the bit represented by the data signal in that bit period is a 1 or a 0.

Figure 2:
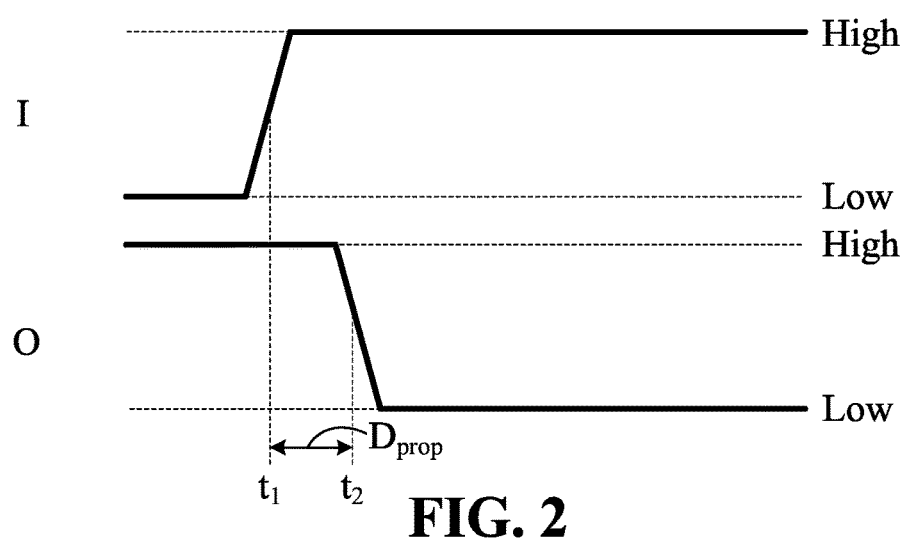
FIG. 2 illustrates propagation delay in the CMOS inverter of FIG. 1.

When a transition in the data occurs, the voltage at the input I will change, and then so will the voltage at the output O. For example, assume that a transition from 0 to 1 occurs in the data, and therefore the data signal at the input I of the inverter 102 transitions from a low voltage to a high voltage. The output O of the inverter 102 will therefore transition from a high voltage to a low voltage. However, there is a propagation delay through the inverter 102. That is, the output O of the inverter 102 does not transition at the exact same instance the input I of the inverter 102 makes the transition. This propagation delay is illustrated in FIG. 2. The input I transitions from low to high at time $t_1$, which causes the output to transition from high to low at time $t_2$. The difference between $t_1$ and $t_2$ is the propagation delay $D_{prop}$.

The propagation delay $D_{prop}$ changes as a function of the CMOS power supply potential $V_{dd}$–$V_{ss}$. Ideally, the CMOS power supply potential $V_{dd}$–$V_{ss}$ would not change during operation. However, in practice the integrated circuit chip in which the CMOS circuitry is implemented often has a limited amount of on-chip capacitance to decouple gate transition current spikes. Also, the power supply has series resistance, as well as series induction from potentially many sources (e.g. the bondswire, bump, package/substrate trace, or power supply metal routing). These elements act to create a power supply network forming an RLC filter having a resonance peak. Every time there is a data transition in the data signal, the current spikes in the CMOS circuits draw their current thru this power supply network, which filters the current spikes, thereby transferring the frequency content of the data onto the power supply potential ($V_{dd}$–$V_{ss}$) as a function of the filter response.

Figure 3:
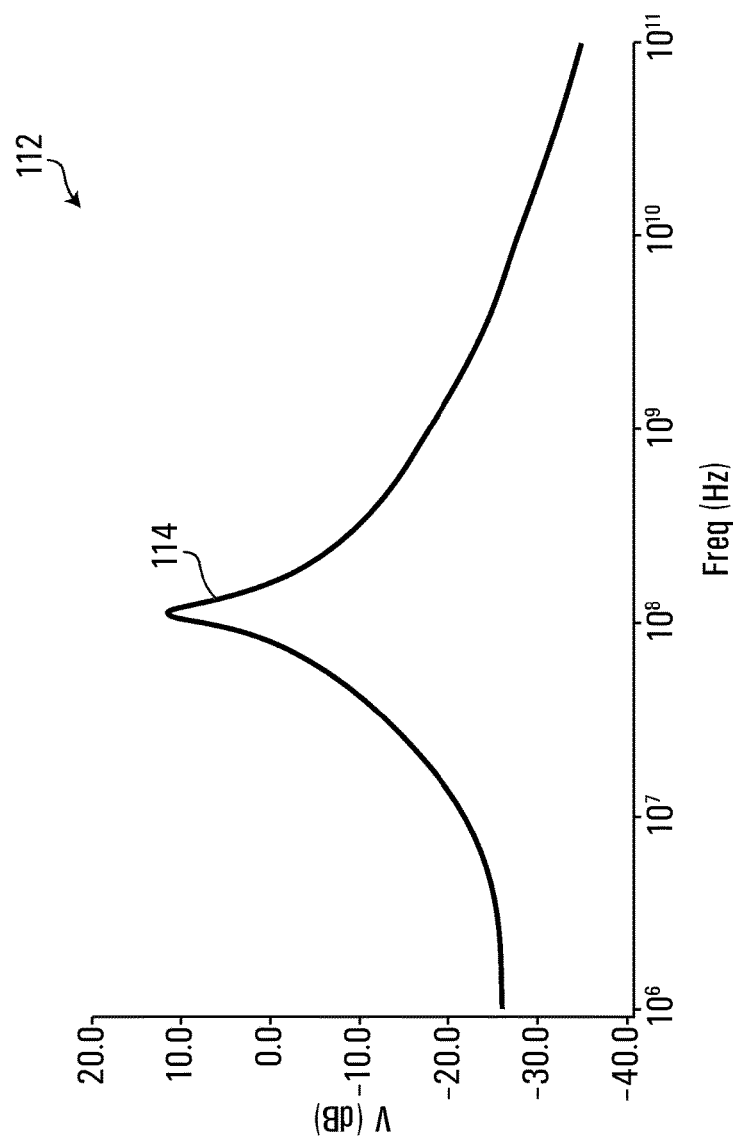
FIG. 3 illustrates an example frequency response of a supply note with a resonance peak.

As an example, FIG. 3 illustrates a frequency response 112 of a power supply node with a resonance peak 114. As mentioned above, the data passing through the CMOS circuitry is random or pseudo-random and therefore has frequency content. Depending upon the length of the pattern of bits represented by the data signal, this may include frequencies well below the resonance peak 114.

Assuming the example filter response illustrated in FIG. 3, the high frequency spikes from the data transitions (e.g. above $10^{11}$ Hz) disappear relatively quickly, but the lower data content frequencies remain or are amplified, resulting a random (or pseudo-random) variation in the power supply potential ($V_{dd}$–$V_{ss}$), with a primary fundamental frequency somewhere around the resonant peak 114 in the example illustrated filter response. This power supply variation affects the propagation delays of the CMOS gates in the data path (i.e. it changes propagation delay $D_{prop}$ in FIG. 2). Assuming the data is passed through several CMOS logic circuits in series, the varying propagation delays thru the CMOS logic circuits results in data output transitions that vary randomly (or pseudo-randomly) in time when compared to a fixed clock reference. This is power supply generated jitter on the output. The more CMOS gates in series or the larger the power supply voltage excursions, then (generally speaking) the larger the magnitude of the output jitter generated.

Figure 4:
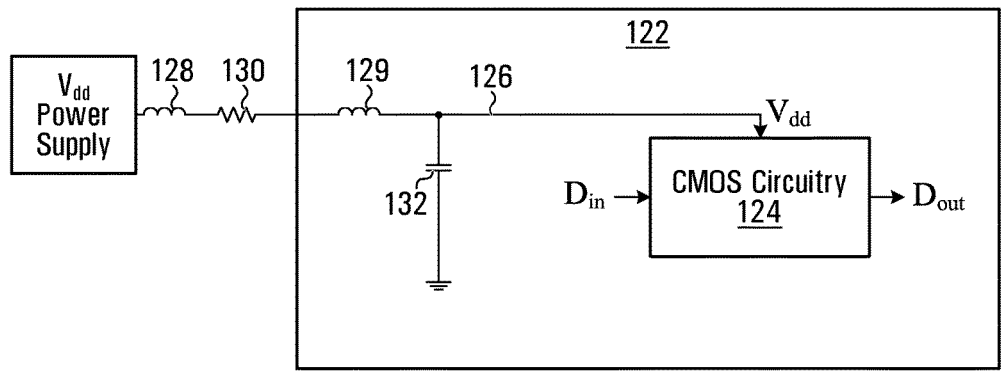
FIG. 4 is a simplified block diagram of an integrated circuit die having CMOS circuitry.

FIG. 4 is a block diagram of an integrated circuit die 122 having CMOS circuitry 124. The CMOS circuitry 124 receives an input data signal $D_{in}$ and produces an output data signal $D_{out}$. As an example, the CMOS circuitry 124 may be a series of inverters or equivalent CMOS logic meant to amplify the drive of the input signal $D_{in}$, as described later.

The CMOS circuitry 124 is powered by a supply voltage $V_{dd}$, and a physical path 126 between the supply source $V_{dd}$ and the CMOS circuitry 124 is illustrated It is assumed that $V_{ss}$ is GND and therefore $V_{ss}$ (and its physical path) is not illustrated. Consistent with the explanation above, the physical path 126 between $V_{dd}$ and the CMOS circuitry 124 includes induction and resistance, which are shown modelled by inductors 128 and 129, as well as resistor 130. On-chip capacitance, illustrated as capacitor 132, is included to try to decouple gate transition current spikes. The induction, resistance, and capacitance form an RLC filter. Assuming a filter response as illustrated in FIG. 3, the high frequency noise content from the data transitions (e.g. above $10^{11}$ Hz) are better filtered than the low frequency content. The data transitions in signal $D_{in}$ are random (or pseudo-random), and so the resulting supply noise introduced by the data transitions has wide frequency content. That is, such power supply noise has both low and high frequencies. As mentioned above, the RLC filter cannot filter out the lower frequency content as effectively, and thus $V_{dd}$ varies and more jitter may occur.

Figure 5:
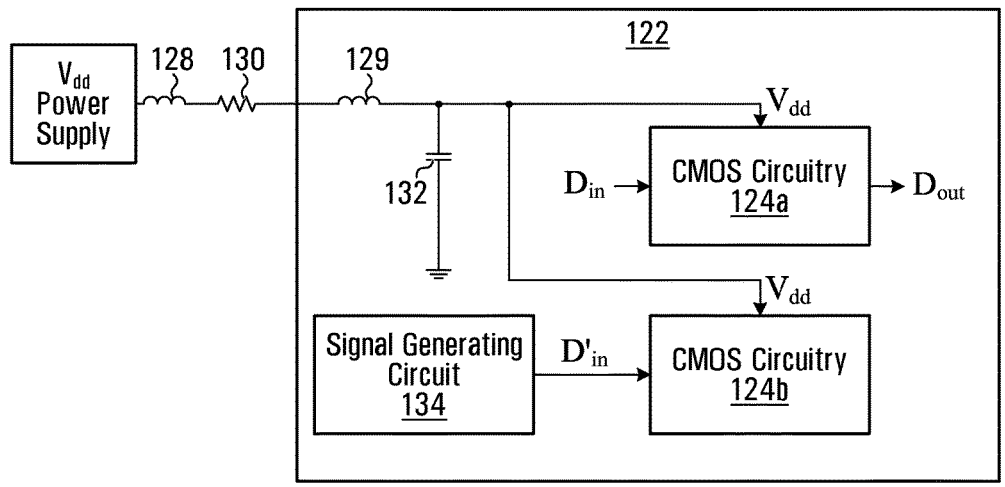
FIG. 5 is a block diagram of the integrated circuit of FIG. 4, but modified to have two copies of the CMOS circuitry.

FIG. 5 is a block diagram of the same integrated circuit die 122, but modified to have two copies of the CMOS circuitry 124. These are labelled as CMOS circuitry 124a and CMOS circuitry 124b. CMOS circuitry 1241 is a copy of CMOS circuitry 124a. In this embodiment, CMOS circuitry 124a and 124b are matched so that the capacitive loads are the same for each, so that data transition current spikes will be the same in each when they switch. CMOS circuitry 124a and CMOS circuitry 124b are also both connected to the same power supply $V_{dd}$. CMOS circuitry 124a is part of the actual data path and receives first data signal $D_{in}$. CMOS circuitry 124b is for transition balancing and receives a second data signal $D'_{in}$. The die 122 further includes signal generating circuit 134 to generate the second data signal $D'_{in}$ so that the second data signal $D'_{in}$ is a version of the first data signal $D_{in}$ with every second bit inverted (i.e. every other bit inverted). The circuitry of the signal generating circuit 134 is implementation specific, and examples are provided later in the context of specific embodiments. As will be clear from the examples later, in some embodiments $D'_{in}$ may be generated by having the signal generating circuit 134 directly modify a copy of $D_{in}$. In other embodiments, two or more lower-rate data signals may combined to produce $D_{in}$, and a copy of the two or more lower-rate data signals may also be appropriately modified and then combined to produce $D'_{in}$.

Figure 6:
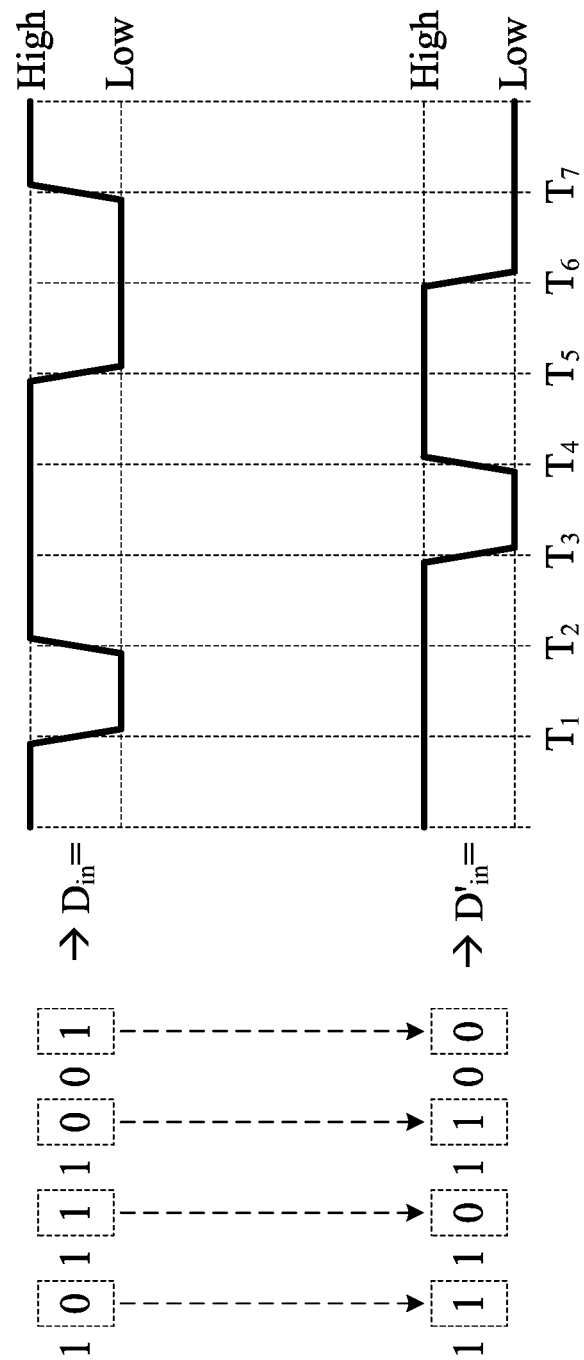
FIG. 6 illustrates an example of a first data signal $D_{in}$ and a second data signal $D'_{in}$.

CMOS circuitry 124b receives the second data signal $D'_{in}$ in parallel to CMOS circuitry 124a receiving the first data signal $D_{in}$, thereby remitting in a data transition in either CMOS circuitry 124a or CMOS circuitry 124b (but not in both) every bit period, due to $D'_{in}$ being a version of the first data signal $D_{in}$ with every second bit inverted. To help understand this, FIG. 6 illustrates an example of first data signal $D_{in}$ and second data signal $D'_{in}$ for the case where the first data signal $D_{in}$ represents the bit pattern 10111001. $D_{in}$ is eight bit periods long, and during each bit period the signal $D_{in}$ is either high voltage (if the corresponding bit is 1) or low voltage (if the corresponding bit is 0). The signal generating circuit 134 therefore produces the second signal $D'_{in}$ such that it is a version of the first data signal $D_{in}$ with every second bit inverted. Therefore, $D'_{in}$ represents the bit pattern 11101100. Note that for every bit period there will be a transition either in $D_{in}$ or in $D'_{in}$. This can be seen in the FIG. 6 example: at time $T_1$ $D_{in}$ transitions from 1 to 0 (high voltage to low voltage) and $D'_{in}$ does not transition; at time $T_2$ $D_2$ transitions from 0 to 1 (low voltage to high voltage) and $D'_{in}$ does not transition; at time $T_3$ $D'_{in}$ transitions from 1 to 0 (high voltage to low voltage) and $D_{in}$ does not transition, etc. That is, at each bit period, one of $D_{in}$ or $D'_{in}$ makes a transition, and the other does not. This is because the second data signal $D'_{in}$ is generated to be the same as the first data signal $D_{in}$ with every second bit inverted. For this reason, the second data signal $D'_{in}$ may be said to represent or provide a transition fill pattern, as it is a data signal that "fills" in the data transitions "missing" from the actual data $D_{in}$.

The FIG. 6 example shows the second data signal $D'_{in}$ generated to be the same as the first data signal $D_{in}$ with every even bit inverted. However, it could instead be the case that the second data signal $D'_{in}$ is generated to be the same as the first data signal $D_{in}$ with every odd bit inverted.

Since $D_{in}$ is input into CMOS circuitry 124a and $D'_{in}$ is input into CMOS circuitry 124b in parallel, then during every bit period there will be a transition in either CMOS circuitry 124a or CMOS circuitry 124b.

Therefore, the signal generating circuit 134 positions data transitions in the regions of consecutive identical bits in the first (primary) data signal $D_{in}$, and on each clock edge, there will be a data transition in either first data signal $D_{in}$ or second data signal $D'_{in}$, which doubles the transition density of the data.

However, CMOS circuitry 124a and 124b are also both connected to the same power supply $V_{dd}$. What this means is that during every bit period there will be a current draw on the power supply $V_{dd}$ from either CMOS circuitry 124a or CMOS circuitry 124b (but not both), and so the effect on power supply $V_{dd}$ will be that of a regular spike at the frequency of the data rate. This is high frequency noise and so may be more effectively filtered out by the RLC filter formed by the inductance 128, 129, the resistance 130, and the capacitor 132. As a result, the jitter on the output signal $D_{out}$ may be reduced. That is, by including CMOS circuitry 124b, which draws its power from the same power supply $V_{dd}$ as CMOS circuitry 124a, and by sending the transition fill pattern $D'_{in}$ to the CMOS circuitry 124b in parallel to $D_{in}$ being sent to CMOS circuitry 124a, the frequency content of the data transitions is affected and becomes more narrowband at a higher frequency. This is able to be more effectively filtered by the RLC filter on the power supply path, and as a result the jitter of the output signal $D_{out}$ may potentially be reduced, particularly if the jitter is affected by transition supply noise. That is, the data frequency content may no longer be transferred onto the power supply. Instead, the carrier frequency (data rate) is transferred onto the power supply, which will be better filtered out, and/or at least generate synchronous noise (i.e. the same in every bit period), thereby possibly reducing jitter (because it is the same in every bit regardless of the transitions).

A possible downfall of adding the CMOS circuitry 124b is that it increases the overall power consumption, and it results in additional circuitry compared to if it was not employed. However, this may be outweighed by the possible benefit of achieving a reduction in jitter. Moreover, this method may be used for just certain CMOS circuitry on the die for which output jitter is an important spec (rather than for all CMOS circuitry), such that the additional power consumed and additional circuitry added may not be significant relative to the total amount of power consumed by the die and relative to the total amount of circuitry on the die. That is, by using the method just at critical points, the additional expenditure of power (and additional circuitry) can be judicially used to possibly enhance the jitter performance.

Figure 7:
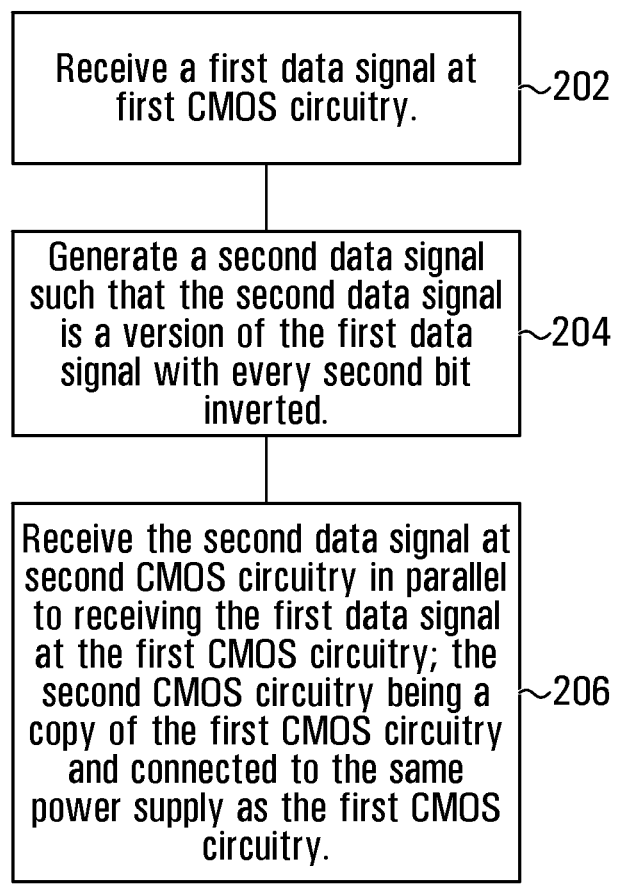
FIG. 7 is a block diagram of an example method performed in a circuit.

FIG. 7 is a block diagram of an example method performed in a circuit, such as in the circuit of FIG. 5. In step 202, a first data signal representing a plurality of bits is received at first CMOS circuitry. In step 204, a second data signal is generated so that the second data signal is a version of the first data signal with every second bit of the plurality of bits inverted. In step 206, the second data signal is received at second CMOS circuitry in parallel to receiving the first data signal at the first CMOS circuitry. The second CMOS circuitry is connected to the same power supply as the first CMOS circuitry, and the second CMOS circuitry is a copy of the first CMOS circuitry.

Regarding the method in FIG. 7, it is important to note the following. First, it is mentioned above (and in the FIG. 5 embodiment), that the second CMOS circuitry is a copy of the first CMOS circuitry. More generally, the second CMOS circuitry does not need to be a copy of the first CMOS circuitry. It is contemplated more broadly that there does not have to be any relationship between the first CMOS circuitry and the second CMOS circuitry. That being said, the method will likely have better performance if the second CMOS circuitry is at least substantially the same as the first CMOS circuitry. By "substantially the same", it is meant that the logic set of the second CMOS circuitry may not be identical to the logic set of the first CMOS circuitry, but that the logic of the second CMOS circuitry would aim to replicate (or aim to be close to or similar to replicating) the first circuit's power draw for data transitions on the common power supply. That is, the second CMOS circuitry would aim to have a similar current draw on data transitions, as this is what transfers the data frequency content to the power supply potential. The number of gates, their type, and even their position may be irrelevant in the second CMOS circuitry. The second CMOS circuitry does not need to be functional or functionally reliable to be substantially the same as the first CMOS circuitry.

One way to create a second CMOS circuitry that is substantially the same as the first CMOS circuitry is to have the second CMOS circuitry simply replicate the first CMOS circuitry and its output load. However, more generally, this is not required. As an example, the second CMOS circuitry may use fewer gates than the first CMOS circuitry with a tailored load capacitance that is crafted to induce a current spike in the power supply that is similar to the first CMOS circuitry. As another example, resistors and/or capacitors (e.g. an RC network) may be inserted between some or all of the CMOS gates in the second CMOS circuitry. As another example, the complementary signals in the second CMOS circuitry may not stay separated.

Also, in step 204 above, it is mentioned that the second data signal is generated so that the second data signal is a version of the first data signal with every second bit of the plurality of bits inverted. This is the case, for example, in transition fill pattern $D'_{in}$ in FIGS. 5 and 6. What is meant by this is that there is a point during operation in which a first data signal is received at first CMOS circuitry representing a plurality of bits of some duration, and a second data signal is generated so that the second data signal is a version of that first data signal with every second bit of that bit sequence inverted. It is not meant to imply that there is never a point during operation in which a transition does not occur on either the first CMOS circuitry or the second CMOS circuitry. In the envisioned examples described in relation to the figures, there is always a data transition every bit period, but more generally this need not be the case. For example, it may be possible to configure the circuitry and/or method so that there may be some bit periods during which a transition does not occur. That is, the transition density may be engineered so that most of the data dependent frequency content is prevented from being transferred to the power supply or only that content is transferred that is easy to filter out. Such a configuration may provide a more acceptable power versus performance trade-off. However, there will at least be some point during operation in which a first data signal representing a plurality of bits of some duration is input into the first CMOS circuitry, and a second data signal is generated so that the second data signal is a version of that first data signal with every second bit of that plurality of bits inverted to create a transition fill pattern for at least that sequence of bits.

Some specific implementation examples will now be described.

Figure 8:
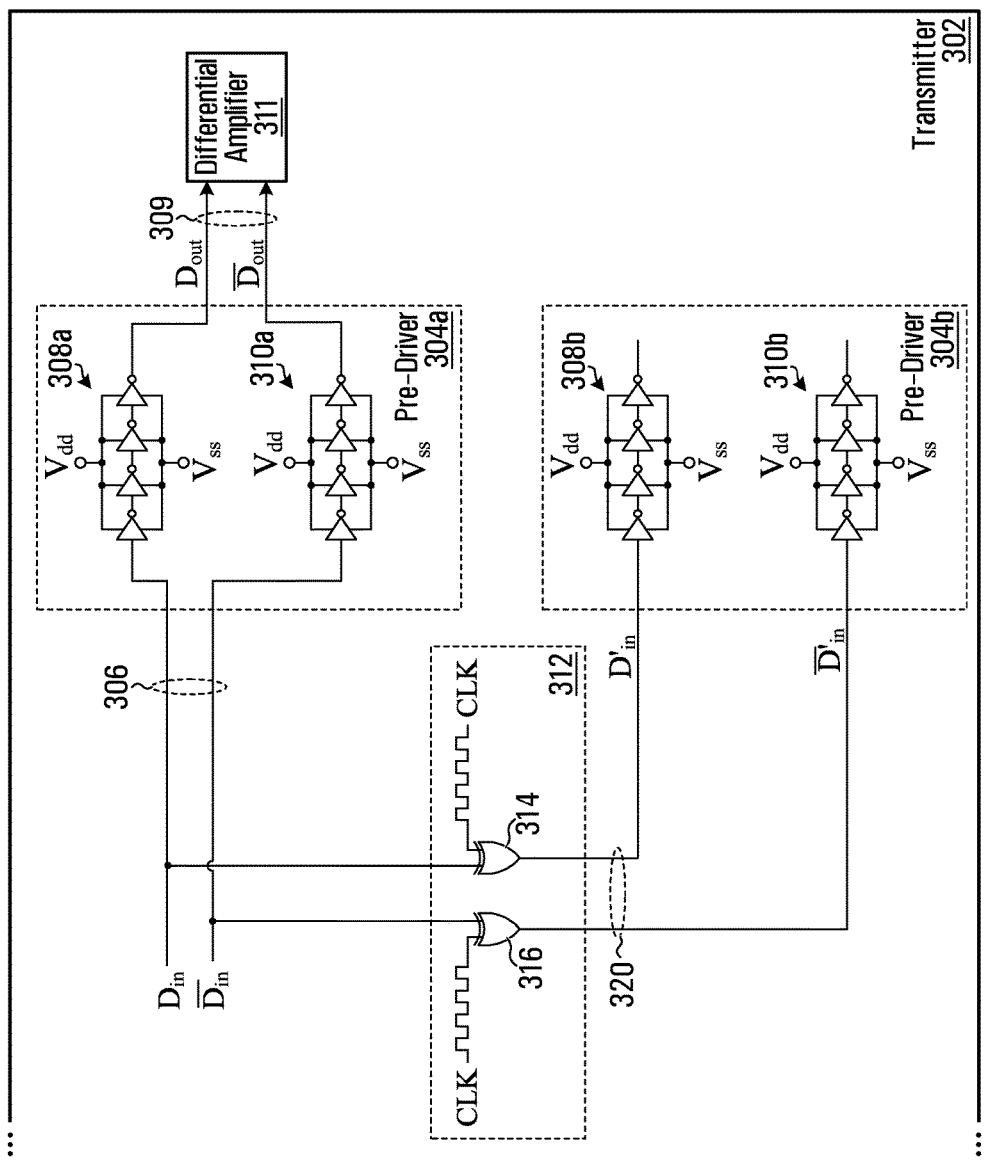
FIG. 8 is a simplified block diagram of an example full-rate transmitter.

FIG. 8 is a block diagram of an example full-rate transmitter 302 having a pre-driver 304a for receiving a first data signal 306. The first data signal 306 is in differential form and therefore comprises two signals: data signal $D_{in}$ and inverted data signal $\overline{D_{in}}$. As an example, the pre-driver 304a is implemented by two chains of CMOS inverters: a first chain 308a comprising four CMOS gates connected in series and to receive data signal $D_{in}$ and produce a drive-amplified data signal $D_{out}$, and a second chain 310a also comprising four CMOS gates connected in series and to receive inverted data signal $\overline{D_{in}}$ and produce a drive-amplified inverted data signal $\overline{D_{out}}$, $D_{out}$ and $\overline{D_{out}}$ together are a differential output data signal 309, which is coupled to an output driver, illustrated as a differential amplifier 311.

The transmitter 302 also includes a second pre-driver 304b that is a copy of the first pre-driver 304a. The second pre-driver 304b is connected to a load capacitance (not illustrated) that is equivalent to the input capacitance of the output driver to which the first pre-driver 304a is connected. In some embodiments, the input capacitance of the output driver may change and the load capacitance of the second pre-driver 304b may be tuned to match the input capacitance of the output driver.

In this example, the second pre-driver 304b is also implemented by two chains of CMOS inverters; first chain 308b comprising four CMOS gates connected in series and to receive a data signal $D'_{in}$, and a second chain 310b also comprising four CMOS gates connected in series and to receive a data signal $\overline{D'_{in}}$. The CMOS gates of both pre-drivers 304a and 304b are all connected to the same two power supplies $V_{dd}$ and $V_{ss}$. In this example it is assumed more generally that $V_{ss}$ is not necessarily GND.

Although not illustrated in FIG. 8, the transmitter 302 includes a decoupling capacitor that (in combination with the inductance and resistance of the power supply path) results in a filter that filters power supply noise. Such filtering is more effective at filtering out higher frequency power supply noise rather than lower frequency power supply noise.

The transmitter 302 further includes additional logic circuitry 312 that also receives the first data signal 306. The logic circuitry 312 comprises two exclusive or blocks XOR 314 and XOR 316. XOR 314 performs an exclusive-or of $D_{in}$ and a clock of the same rate as $D_{in}$ to produce $D'_{in}$, and XOR 316 performs an exclusive-or of $\overline{D_{in}}$ and the same clock to produce $\overline{D'_{in}}$. By doing so, the output of the logic circuitry 312 is a second data signal 320 that is equal to the first data signal 306, but with every second bit inverted. This is because the clock has a value that toggles between "0" and "1", and when "0" is XOR'd with a bit of a data signal that data bit will not change, but when "1" is XOR'd with a bit of the data signal that data bit will invert. Hence, performing an XOR between the clock and a data signal will invert every second bit represented by that data signal.

In operation, the first data signal is 306 is received at and passes through pre-driver 304a, with each CMOS gate in pre-driver 304a performing drive amplification so that the output 309 of the pre-driver 304a is prepared for the differential amplification stage performed by the differential amplifier 311. A copy of the first data signal 306 is also received by the logic circuitry 312, which performs the XOR operation to produce the second data signal 320. The second data signal 320 is received at and passes through pre-driver 304b in parallel to the first data signal 306 being received at and passing through pre-driver 304a. Note that there may need to be some circuitry in place (not illustrated) to ensure that the first data signal 306 and the second data signal 320 are appropriately bit aligned at their respective pre-drivers. For example, in one embodiment, re-timing latches may be provided after the logic circuitry 312, but before the pre drivers, to synchronize the transitions, in such a case, the logic circuitry 312 may be connected to power supplies $V'_{ss}$ and $V'_{dd}$ (not illustrated) that are different from the power supplies $V_{dd}$ and $V_{ss}$ to which the pre drivers are connected. Any other CMOS circuitry prior to the final re-timing could also be connected to power supplies $V'_{ss}$ and $V'_{dd}$.

Pre-driver 304b does perform drive amplification of the second data signal 320. However, the output of the pre-driver 304b is not used. Instead, the pre-driver 304 receiving second data signal 320 is to "fill in" any "missing" data transitions in the actual data path so that every bit period there is a data transition, either in pre-driver 304a or the pre-driver 304b. As discussed above, having a data transition every bit period may prevent having the data dependent frequency content transferred to the power supply, such that only the carrier frequency is transferred, which is higher-frequency and more narrow band and may be more effectively filtered out by decoupling, and hence the jitter on the data output signal 309 may be reduced compared to if logic circuitry 312 and pre-driver 304b were not present.

It will be appreciated that the transmitter 302 may include other circuit components, but that these have been omitted from FIG. 8 for the sake of clarity. Also, although the logic circuitry 312 used to generate the second data signal 320 is illustrated in FIG. 8 as XOR gates 314 and 316, in an alternative embodiment multiplexer circuitry be used instead, as follows: $D_{in}$ and $\overline{D_{in}}$ are input into a multiplexer with selection of the input controlled by a clock, so that there is alternate selection of $D_{in}$ and $\overline{D_{in}}$ to result in $D'_{in}$ as the output of the multiplexer. $\overline{D'_{in}}$ may be produced by inverting $D'_{in}$, or by using a second multiplexer that also accepts $D_{in}$ and $\overline{D_{in}}$ as an input and with selection controlled by a clock inverted compared to the clock used by the first multiplexer to create $D'_{in}$. The clock(s) driving the multiplexer(s) may also re-time the signals.

Note that pre-driver 304a may be considered an example of the first CMOS circuitry 124a in FIG. 5, the pre-driver 304b may be considered an example of the second CMOS circuitry 124b in FIG. 5, and the logic circuitry 312 may be considered an example of the signal generating circuit 134 in FIG. 5.

Figure 9:
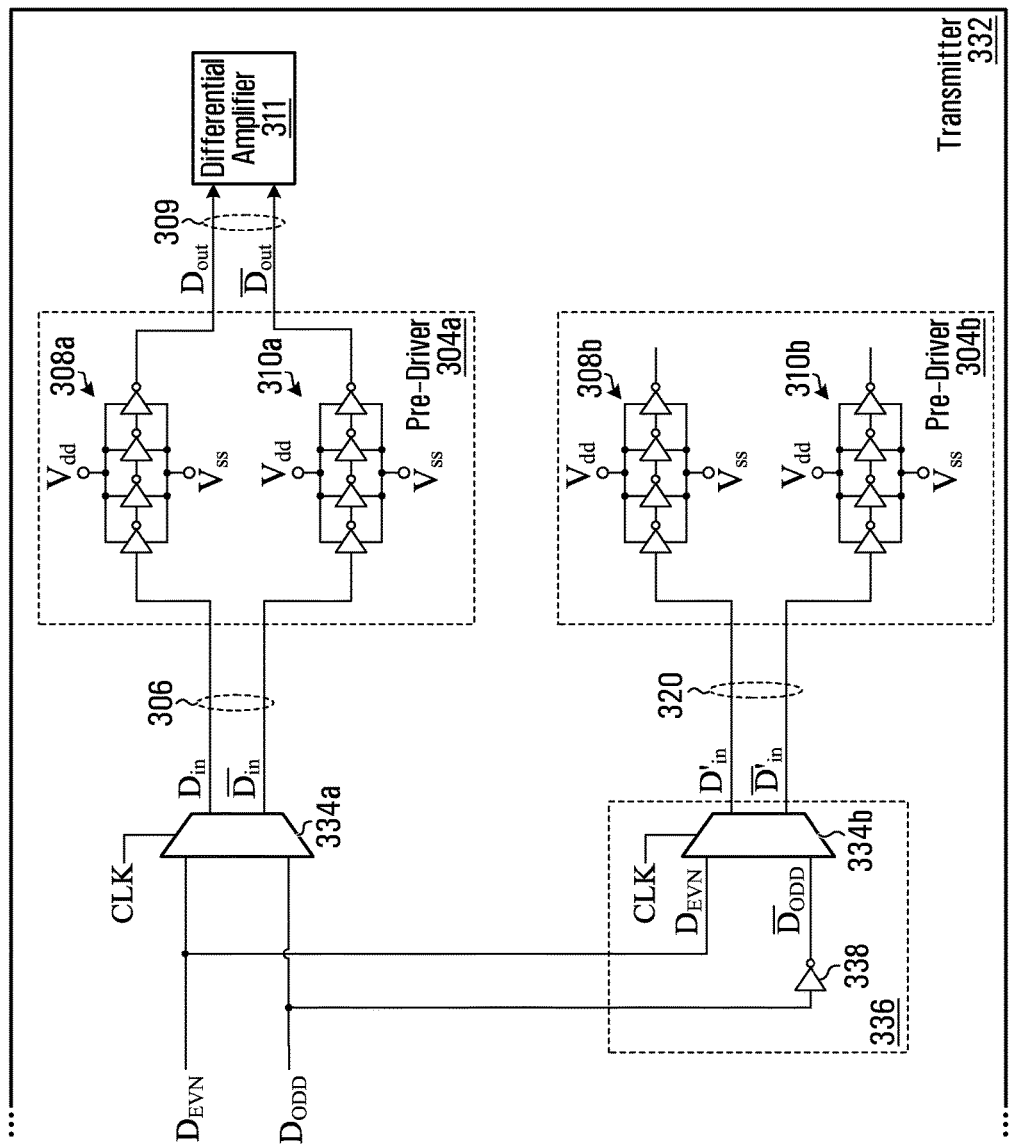
FIG. 9 is a simplified block diagram of an example half-rate transmitter.

FIG. 9 is a block diagram of an example half-rate transmitter 332. The pre-drivers and differential amplifier portion of the transmitter operate the same way as that described in relation to FIG. 8, and therefore these blocks have been designated with the same reference numbers as FIG. 8 (i.e. 304a, 304b, and 311), and a discussion of their operation will not be repeated.

Unlike the full-rate transmitter 302 of FIG. 8, the half-rate transmitter 332 of FIG. 9 has two data signals each at half rate, labelled $D_{EVN}$ and $D_{ODD}$. A multiplexer 334a multiplexes the $D_{EVN}$ and $D_{ODD}$ signals up to full rate signal $D_{in}$. In this embodiment, the multiplexer 334a also includes additional circuitry, such as an inverter (not illustrated), to create an inverted version of $D_{in}$ (i.e. $\overline{D_{in}}$) so as to result in the differential data signal 306. A clock CLK acts as the selector for the multiplexer 334a to select which input ($D_{EVN}$ or $D_{ODD}$) is output by the multiplexer 334a. The CLK frequency and phase is appropriately correlated with the data signals $D_{EVN}$ and $D_{ODD}$ so that when the CLK is "high" one of $D_{EVN}$ and $D_{ODD}$ is selected, and when the CLK is "low" the other of $D_{EVN}$ and $D_{ODD}$ is selected, such that the CLK interleaves the two half-rate data signals $D_{EVN}$ and $D_{ODD}$ to create full-rate signal $D_{in}$. The CLK may also re-time the signal to reduce the amount of jitter on the full-rate data signal 306 exiting the multiplexer 334a.

Since the half-rate transmitter 332 has half-rate data signals $D_{EVN}$ and $D_{ODD}$, these are used to create $D'_{in}$ and $\overline{D'_{in}}$. In particular, rather than having the logic circuitry 312 of the FIG. 8 embodiment, in FIG. 9 circuitry 336 is provided comprising an inverter 338 for inverting $D_{ODD}$ and a copy of multiplexer 334a, which is labelled as 334b.

In operation, half-rate data signals $D_{EVN}$ and $D_{ODD}$ are multiplexed together via multiplexer 334a to produce full-rate data signal $D_{in}$, and $\overline{D_{in}}$ also created as part of the multiplexer circuitry to result in data signal 306. A copy of half-rate data signals $D_{EVN}$ and $D_{ODD}$ is also sent to circuitry block 336, where $D_{ODD}$ is inverted by inverter 338 to result in $\overline{D_{ODD}}$, and then $D_{EVN}$ and $\overline{D_{ODD}}$ are multiplexed together via multiplexer 334b to produce full-rate data signal $D'_{in}$. $\overline{D'_{in}}$ is also created as part of the multiplexer circuitry to result in data signal 320. The data signals 306 and 320 are then sent to their respective pre-drivers (304a and 304b) and operated upon in the manner described with respect to FIG. 8.

Note that by inverting $D_{ODD}$ at inverter 338, the resulting $D'_{in}$ is the same as $D_{in}$, but with every second bit inverted.

This is because the multiplexer 334b interleaves $\overline{D_{ODD}}$ (i.e. inverted $D_{ODD}$) with $D_{EVN}$. Alternatively, the inverter 338 could invert $D_{EVN}$ instead of $D_{ODD}$.

It will be appreciated that the transmitter 332 may include other circuit components, but these have been omitted from FIG. 9 for the sake of clarity. Also, note that the circuitry 336 may be considered an example of the signal generating circuit 134 in FIG. 5.

Figure 10:
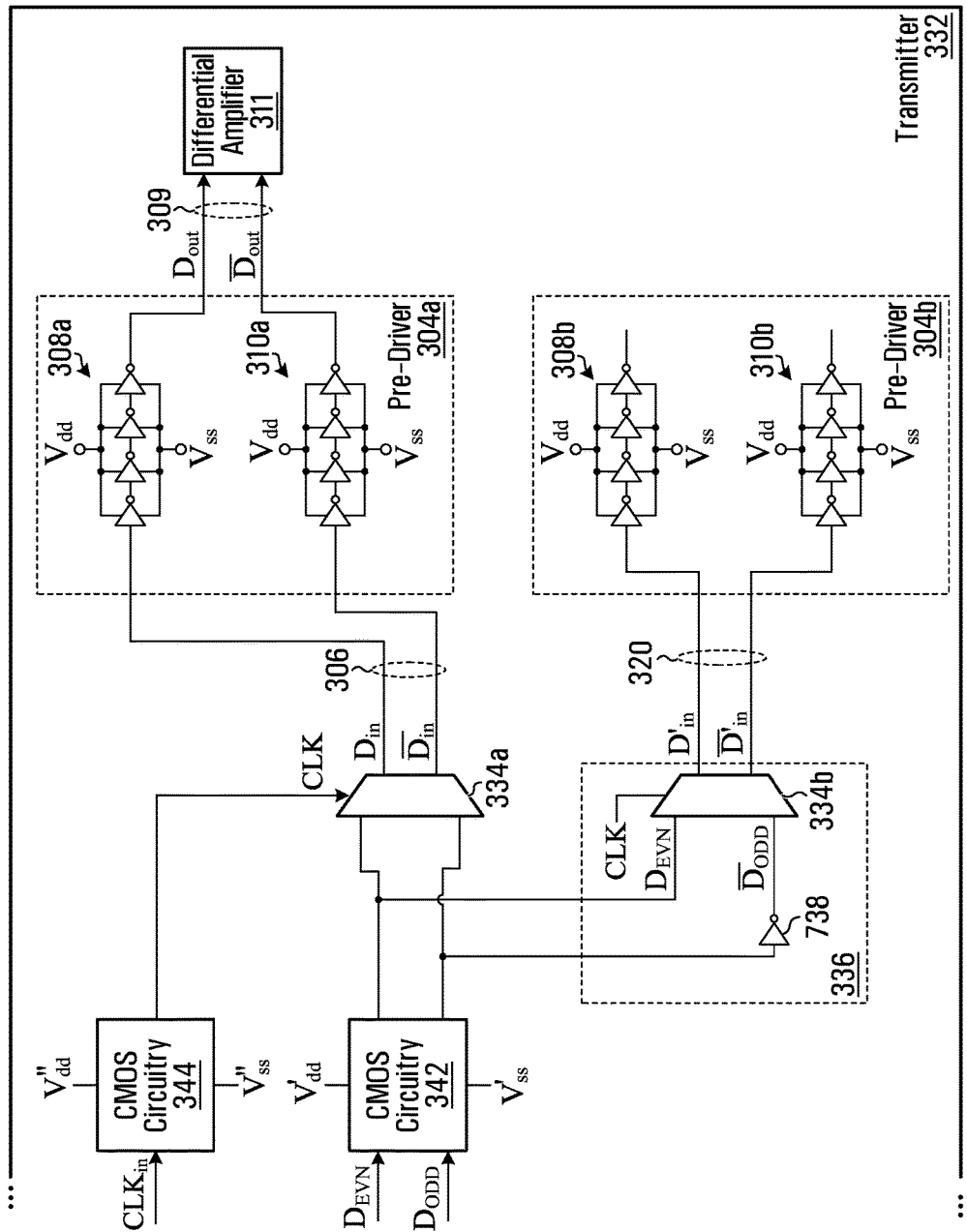
FIG. 10 is the example of FIG. 9, but showing the half-rate signals processed by CMOS circuitry prior to being multiplexed up to full-rate.

FIG. 10 is the FIG. 9 example, but showing the situation in which half-rate signals $D_{EVN}$ and $D_{ODD}$ are processed by some CMOS circuitry 342 prior to being multiplexed up to full-rate by multiplexer 334a. The power supply $V'_{dd}$ used for the CMOS circuitry 342 is different from the power supply $V_{dd}$ used for the pre-drivers 304a and 304b. That is, the CMOS circuitry 342 is connected to another power supply $V'_{dd}$ and not the power supply $V_{dd}$ of the pre-drivers. This may be achieved by having two different pins on the chip die (one pin for inputting $V_{dd}$ and one pin for inputting $V'_{dd}$). $V_{dd}$ and $V'_{dd}$ may ultimately originate from the same ball on the package, but in such a case would be split and routed to the two different pins on the die so that they provide different power domains. Similarly, the CMOS circuitry 342 is also connected to another $V'_{ss}$ and not the $V_{ss}$ to which the pre-drivers 304a and 304b are connected.

In the FIG. 10 embodiment, CMOS circuitry 344 is also part of the clock path, and this CMOS circuitry 344 is not connected to either $V_{dd}$ or $V'_{dd}$, but is connected to another power supply $V''_{dd}$. This may also be achieved, for example, by having $V''_{dd}$ as a separate pin on the die. Similarly, CMOS circuitry 344 is not connected to either $V_{ss}$ or $V'_{ss}$ but is connected to another $V''_{ss}$. A possible benefit of connecting to the different power supplies is that then the data transitions in CMOS circuitry 342 may not contaminate the power supply used for the pre-drivers 304a and 304b. That is, the data transitions in CMOS circuitry 342 may not create data-transition power supply noise on the power supply used for the pre-drivers 304a and 304b. Similarly, the data transitions in CMOS circuitry 342 may not contaminate the power supply used by the CMOS circuitry 344 for producing CLK. Connecting the CMOS circuitry 344 in the clock path to a power supply different from the power supply of the pre-drivers 304a and 304b may also prevent the pre-driver 304a and 304b from inadvertently contaminating the power supply used to produce CLK.

Although the FIG. 10 embodiment includes both CMOS circuitry 342 and CMOS circuitry 344, it may instead be the case that only one of such circuitry (either CMOS circuitry 342 or CMOS circuitry 344) is present. Also, if both are present, it may instead be the case that CMOS circuitry 342 and CMOS circuitry 344 are connected to the same power supply, which may be different from or the same as the power supply for pre-drivers 304a and 304b. However, connecting all such circuitry to the same power supply does not result in the possible benefit discussed above.

Figure 11:
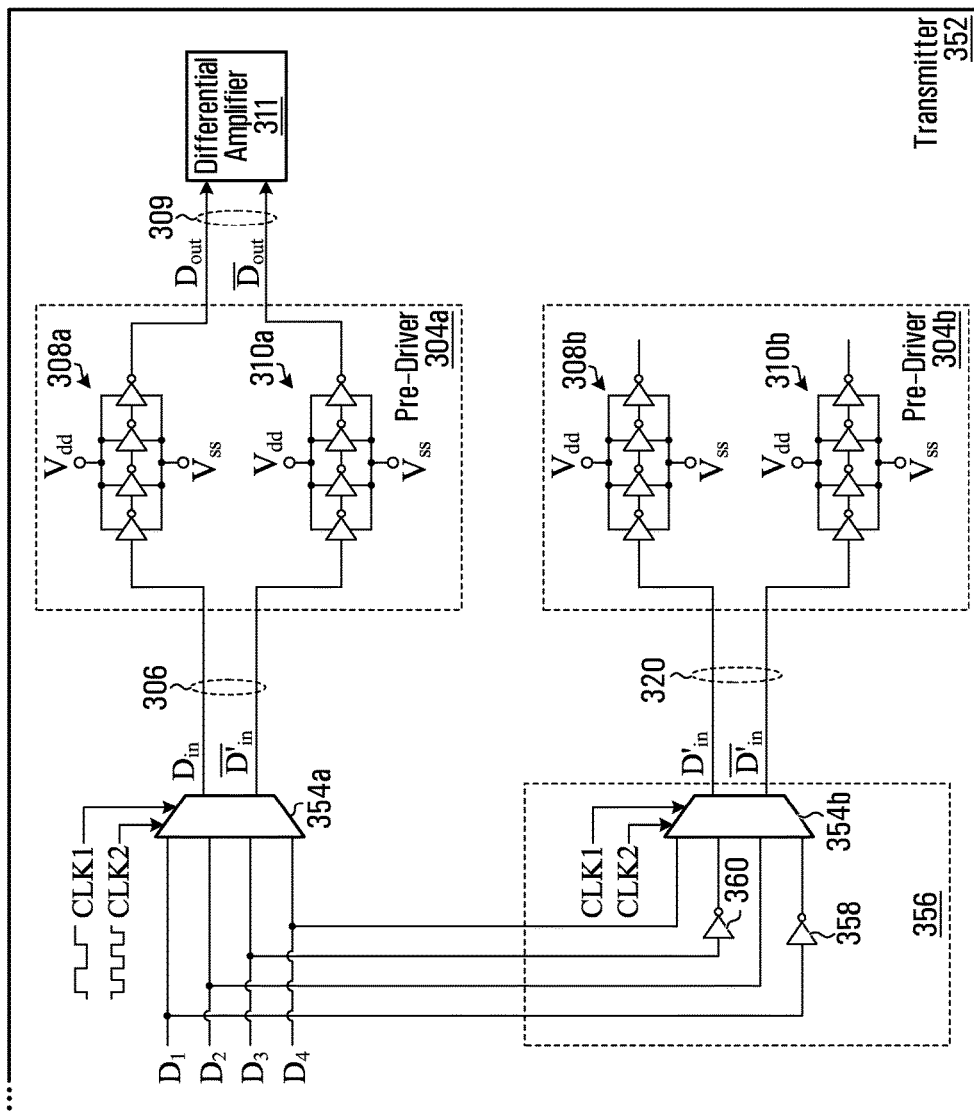
FIG. 11 is a simplified block diagram of an example quarter-rate transmitter.

FIG. 11 is a block diagram of an example quarter-rate transmitter 352. The pre-drivers and differential amplifier portion of the transmitter operate the same way as that described in relation to FIG. 8, and therefore these blocks have been designated with the same reference numbers as FIG. 8 (i.e. 304a, 304b, and 311), and a discussion of their operation will not be repeated.

Unlike the full-rate transmitter 302 of FIG. 8, the quarter-rate transmitter 332 of FIG. 11 has four data signals each at quarter rate, and each respectively labelled $D_1$, $D_2$, $D_3$, and $D_4$. A multiplexer 354a multiplexes the four quarter-rate signals up to full rate signal $D_{in}$. In this embodiment, the multiplexer 354a also includes additional circuitry, such as an inverter (not illustrated), to create an inverted version of $D_{in}$ (i.e. $\overline{D_{in}}$) so as to result in the differential input data signal 306. Two clocks CLK1 and CLK2 act as the selector for the multiplexer 354a to select which input ($D_1$, $D_2$, $D_3$, or $D_4$) is output by the multiplexer 354a. The frequency and phase of each of CLK1 and CLK2 is appropriately correlated with the data signals $D_1$, $D_2$, $D_3$, and $D_4$ so that each of data signals $D_1$, $D_2$, $D_3$, and $D_4$ is selected and output in a round-robin fashion to result in full-rate signal $D_{in}$. The multiplexer 354a may also re-time the output signal to reduce the amount of jitter on the full-rate data signal 306 exiting the multiplexer 354a.

Since the quarter-rate transmitter 352 has quarter-rate data signals $D_1$, $D_2$, $D_3$, and $D_4$, these are used to create $D'_{in}$ and $\overline{D'_{in}}$. In particular, rather than having the logic circuitry 312 of the FIG. 8 embodiment, in FIG. 11 circuitry 356 is provided comprising an inverter 358 for inverting $D_1$, another inverter 360 for inverting $D_3$, and a repeat of multiplexer 354a, which is labelled as 354b.

In operation, quarter-rate data signals $D_1$ to $D_4$ are multiplexed together via multiplexer 354a to produce full-rate data signal $D_{in}$, and $\overline{D_{in}}$ is also created as part of the multiplexer circuitry to result in data signal 306. A copy of quarter-rate data signals $D_1$ to $D_4$ are also sent to circuitry block 356, where $D_1$ is inverted by inverter 358 to result in $\overline{D_1}$, and where $D_3$ is inverted by inverter 360 to result in $\overline{D_3}$, and then $\overline{D_1}$, $D_2$, $\overline{D_3}$, and $D_4$ are multiplexed together via multiplexer 354b to produce full-rate data signal $D'_{in}$. $\overline{D'_{in}}$ is also created as part of the multiplexer circuitry to result in data signal 320. The data signals 306 and 320 are then sent to their respective pre-drivers (304a and 304b) and operated upon in the manner described with respect to FIG. 8.

Note that by inverting $D_1$ and $D_3$, the resulting $D'_{in}$ is the same as $D_{in}$, but with every second bit inverted. This is because the multiplexer 354b multiplexes $\overline{D_1}$, $D_2$, $\overline{D_3}$, and $D_4$ in a round-robin fashion according to the pattern $\overline{D_1}D_2\overline{D_3}D_4\overline{D_1}D_2\overline{D_3}D_4$ . . . Alternatively, $D_2$ and $D_4$ could be inverted instead.

It will be appreciated that the transmitter 352 may include other circuit components, but these have been omitted from FIG. 11 for the sake of clarity. Also, note that the circuitry 356 may be considered an example of the signal generating circuit 134 in FIG. 5.

In the circuits of FIGS. 8 to 11, the pre-drivers may optionally include some control circuitry (not shown) for turning on and off data paths at certain times to try to better optimize power consumption.

Some simulations were performed in relation to a CMOS pre-driver for a half-rate transmitter at a data rate of 28.1 Gbps. The data pattern used in the simulations was a repeating pseudo-random binary sequence 7 (PRBS7) with 66 consecutive identical digits (CID) to emulate high frequency and low frequency content. The transition filling pattern was created by inverting every second bit of that pattern. The PRBS7 was fed to the pre-driver, and the transition filling pattern was sent to an identical pre-driver connected to the same supply as the first one and an equivalent load.

Three scenarios were considered in the simulations:
Scenario 1: No transition fin pattern (or identical pre-driver), but for the ideal situation in which the power supply is ideal and the power supply path has no inductance or resistance.
Scenario 2: Still no transition fill pattern (or identical pre-driver), but for the more realistic situation of the power supply path having inductance and resistance. Specifically, it was assumed that the inductance was 1 nH on the $V_{dd}$ path and 333 pH on the $V_{ss}$ path, and that the resistance was 20 m ohm for each of the $V_{dd}$ and $V_{ss}$ path.
Scenario 3: Scenario 2, but with the transition fill pattern added and fed to an identical pre-driver.

Figure 12:
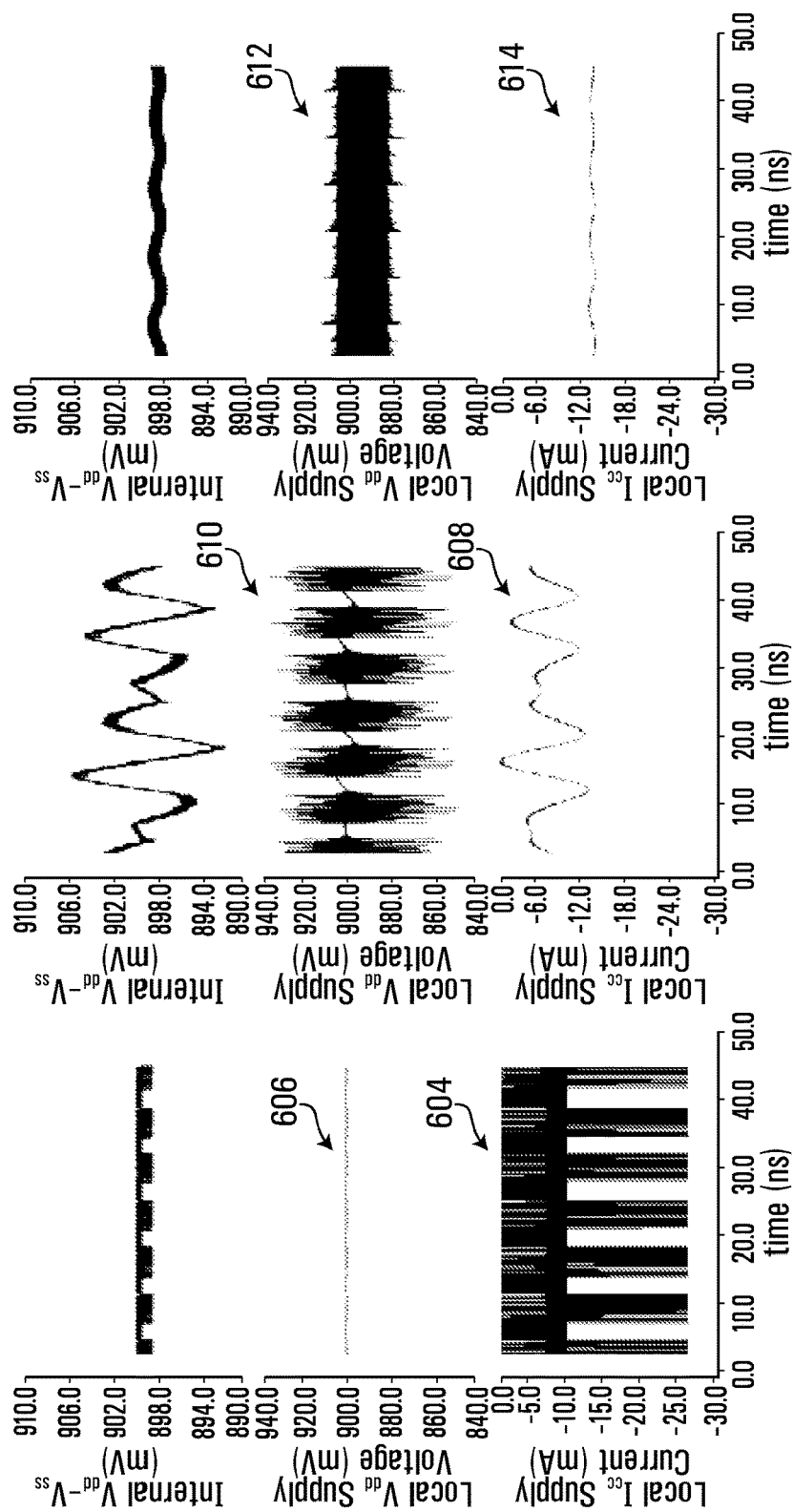
FIG. 12 illustrates plotted transient simulation results for a power supply node.

FIG. 12 illustrates plotted simulation results, where each column respectively corresponds to one of the three scenarios outlined above. The top row is the $V_{dd}$-$V_{ss}$ local (internal) supply voltage. That is, it is the local on-chip positive supply $V_{dd}$ minus the negative supply ($V_{ss}$ or GND). This is measured right at the pre-driver connection. The main ground reference (0 volts) is external to the chip. The ground line on the chip is also susceptible to similar inductance effects as the positive supply and thus varies similarly to the on-chip $V_{dd}$. By taking the difference of the supplies locally, one gets a measure of the actual voltage available for the inverter chain.

The middle row is the $V_{dd}$ lower supply voltage. The bottom row is the local supply current.

The first (left-most) column corresponds to scenario 1 (no transition pattern, ideal power supply path). In this case, the current spikes with every data transition (as shown at 604), but the supply voltage $V_{dd}$ does not spike (as shown at 606). The middle column corresponds to scenario 2 (no transition pattern, but inductance and resistance in the power supply path). The random data transitions cause the filtered current to still vary (as shown at 608), and the voltage $V_{dd}$ spikes (as shown at 610). The last (right-most) column corresponds to scenario 3 (transition fill pattern added). The supply voltage $V_{dd}$ has a constant higher-frequency spike (as shown at 612), and the current is better filtered (as shown at 614).

In each of the three scenarios described above, the jitter in the pre-driver output signal was measured. For scenario 1 (no transition pattern, ideal power supply path), the jitter measurement was 3.96 milli-unit intervals (mUI), where a "unit interval" is the clock period. For scenario 2 (no transition pattern, but inductance and resistance in the power supply path), the jitter measurement increased to 18.32 mUI. For scenario 3 (transition fill pattern added), the jitter measured dropped down to 5.96 mUI.

Figure 13:
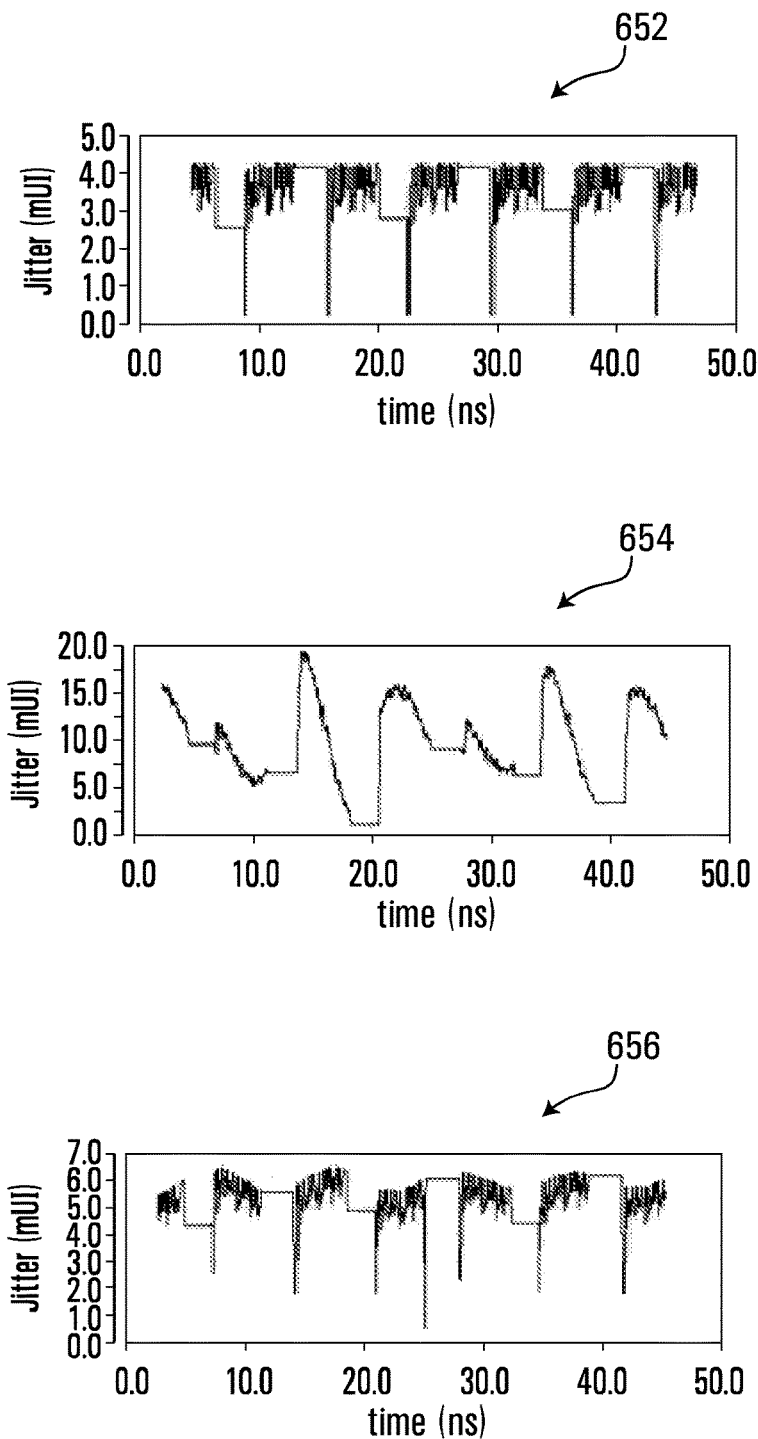
FIG. 13 illustrates plots of transient instantaneous jitter results.

In the simulations, the instantaneous jitter at the output of the pre-driver was also measured for each of the three scenarios. Instantaneous jitter is defined herein as a measure of the deviations of the signal edges, at a defined threshold, with respect to an ideal (or perfect) signal at the same baud rate with an arbitrary starting point. The plotted instantaneous jitter is shown in FIG. 13. The instantaneous jitter is measured based on the first edge encountered, and peak to peak jitter numbers are calculated by cropping the waveform to the last 3 complete cycles (regular and inverted) and finding the difference between the maximum value and the minimum value. In each plot in FIG. 13, the horizontal axis represents time, and the vertical axis represents the amount of jitter measured in mUI. Plot 652 corresponds to scenario 1 (no transition pattern, ideal power supply path), plot 654 corresponds to scenario 2 (no transition pattern, but inductance and resistance in the power supply path), and plot 656 corresponds to scenario 3 (transition fill pattern added). In plot 654 (scenario 2) the jitter due to power supply noise is about 20 mUI, whereas in plot 656 (scenario 3) the jitter due to power supply noise is around 5-6 mUI.

The embodiments described herein may be used in CMOS communication products including, but not limited to: high speed serialize/deserialize (SERDES) receivers/transmitters, advanced modulation receivers/transmitters, clock/data recover (CDR) devices, CMOS transimpedance amplifiers (TIAs), CMOS laser drivers, high speed analog/digital converters (ADC) for adaptive equalization of lossy transmission and other communication impediments and/or the extraction of advanced modulation signals from the transmitted protocol. All of the above CMOS device have common high speed outputs which are attached low jitter performance specifications whose performance may be improved by one or more embodiments described herein.

Although the foregoing has been described with reference to certain specific embodiments, various modifications thereof will be apparent to those skilled in the art without departing from the scope of the claims appended hereto.

The invention claimed is:

1. A transmitter comprising:
   first CMOS circuitry to receive a first data signal representing a plurality of bits;
   a signal generating circuit to generate a second data signal so that the second data signal is a version of the first data signal with every second bit of the plurality of bits inverted; and
   second CMOS circuitry to receive the second data signal in parallel to the first CMOS circuitry receiving the first data signal to result in a data transition in either the first CMOS circuitry or the second CMOS circuitry every bit period for the plurality of bits,
   wherein the first CMOS circuitry and the second CMOS circuitry are connected to a same power supply.

2. The transmitter of claim 1, wherein the transmitter is part of a serializer/deserializer (SERDES).

3. The transmitter of claim 1, wherein the transmitter is part of a serializer.

4. The transmitter of claim 1, wherein the second CMOS circuitry is substantially the same as the first CMOS circuitry.

5. The transmitter of claim 4, further comprising:
   a first multiplexer to multiplex a pair of half-rate data signals to produce the first data signal; and
   wherein the signal generating circuit comprises:
   an inverter to invert one of the pair of half-rate data signals to produce an inverted half-rate data signal, and
   a second multiplexer to multiplex the inverted half-rate data signal with the other one of the pair of half-rate data signals to produce the second data signal.

6. The transmitter of claim 5, wherein the same power supply is a first power supply, and wherein the transmitter further comprises:
   third CMOS circuitry to output the pair of half-rate data signals, the third CMOS circuitry connected to a second power supply and not connected to the first power supply.

7. The transmitter of claim 6, further comprising:
   fourth CMOS circuitry to output a clock used to select an input line of at least the first multiplexer, the fourth CMOS circuitry connected to a third power supply and not connected to the first power supply or the second power supply.

8. The transmitter of claim 1, further comprising:
   a capacitor that creates a filter to filter data frequency content, the data frequency content being made more narrowband by having the data transition in either the first CMOS circuitry or the second CMOS circuitry every bit period for the plurality of bits.

9. The transmitter of claim 4, wherein the first CMOS circuitry comprises:
   a plurality of CMOS gates connected in series to perform drive amplification of the first data signal; and
   wherein the second CMOS circuitry comprises:
   a copy of the plurality of CMOS gates connected in series to perform drive amplification of the second data signal.

10. The transmitter of claim 1, wherein the signal generating circuit comprises:
    an exclusive-or (XOR) logic gate to receive as an input the first data signal and a clock, and to produce as an output the second data signal equal to an XOR of the first data signal and the clock; or
    a multiplexer to receive as an input the first data signal in differential form $D_{in}$ and $\overline{D_{in}}$, and to output the second data signal by alternately selecting between $D_{in}$ and $\overline{D_{in}}$.

11. The transmitter of claim 1, further comprising:
    a first multiplexer to multiplex four quarter-rate data signals to produce the first data signal; and
    wherein the signal generating circuit comprises:
    an inverter to invert one of the quarter-rate data signals to produce a first inverted quarter-rate data signal;
    another inverter to invert another one of the quarter-rate data signals to produce a second inverted quarter-rate data signal; and
    a second multiplexer to produce the second data signal by multiplexing the first inverted quarter-rate data signal, the second inverted quarter-rate data signal, and the remaining other two quarter-rate data signals that were not inverted.

12. A system comprising:
    a first multiplexer to multiplex a pair of half-rate data signals to produce a first full-rate data signal;
    first CMOS circuitry to receive the first full-rate data signal;
    an inverter to invert one of the pair of half-rate data signals to produce an inverted half-rate data signal, and
    a second multiplexer to multiplex the inverted half-rate data signal with the other one of the pair of half-rate data signals to produce a second full-rate data signal; and
    second CMOS circuitry to receive the second full-rate data signal in parallel to the first CMOS circuitry receiving the first full-rate data signal to result in a data transition in either the first CMOS circuitry or the second CMOS circuitry every bit period, the first CMOS circuitry and the second CMOS circuitry being connected to a same power supply, and the second CMOS circuitry being substantially the same as the first CMOS circuitry,
    wherein the system is part of: a serialize/deserialize (SERDES) receiver or transmitter, or an advanced modulation receiver or transmitter, or a clock/data recover (CDR) device, or a CMOS transimpedance amplifier (TIA) circuit, or a CMOS laser driver, or an analog to digital converter (ADC) circuit.

13. The system of claim 12 wherein the first CMOS circuitry comprises a plurality of CMOS gates connected in series to perform drive amplification of the first full-rate data signal, and the second CMOS circuitry comprises a copy of the first CMOS circuitry to perform drive amplification of the second full-rate data signal.

14. A method in a transmitter, the method comprising:
    receiving a first data signal representing a plurality of bits at first CMOS circuitry;
    generating a second data signal so that the second data signal is a version of the first data signal with every second bit of the plurality of bits inverted; and
    receiving the second data signal at second CMOS circuitry in parallel to receiving the first data signal at the first CMOS circuitry to result in a data transition in either the first CMOS circuitry or the second CMOS circuitry every bit period for the plurality of bits, the first CMOS circuitry and the second CMOS circuitry being connected to a same power supply.

15. The method of claim 14, wherein the transmitter is part of a serializer/deserializer (SERDES).

16. The method of claim 14, wherein the transmitter is part of a serializer.

17. The method of claim 14, wherein the second CMOS circuitry is substantially the same as the first CMOS circuitry.

18. The method of claim 17, further comprising:
multiplexing a pair of half-rate data signals to produce the first data signal; and
wherein generating the second data signal comprises:
inverting one of the pair of half-rate data signals to produce an inverted half-rate data signal; and
multiplexing the inverted half-rate data signal with the other one of the pair of half-rate data signals to produce the second data signal.

19. The method of claim 14 further comprising:
filtering data frequency content that is made more narrowband by having the data transition in either the first CMOS circuitry or the second CMOS circuitry every bit period for the plurality of bits.

20. The method of claim 14, wherein the first CMOS circuitry and the second CMOS circuitry each comprise a plurality of CMOS gates connected in series, and wherein the method further comprises:
performing drive amplification of the first data signal in the first CMOS circuitry; and
performing drive amplification of the second data signal in the second CMOS circuitry.

* * * * *